United States Patent [19]

Scardera et al.

[11] Patent Number: 4,761,245
[45] Date of Patent: Aug. 2, 1988

[54] ETCHING SOLUTIONS CONTAINING AMMONIUM FLUORIDE AND AN ALKYLPHENOL POLYGLYCIDOL ETHER SURFACTANT

[75] Inventors: Michael Scardera, Hamden; Thomas S. Roche, Cheshire, both of Conn.

[73] Assignee: Olin Corporation, Cheshire, Conn.

[21] Appl. No.: 7,067

[22] Filed: Jan. 27, 1987

[51] Int. Cl.⁴ .............................................. C09K 13/08
[52] U.S. Cl. .................................... 252/793; 156/657; 156/662
[58] Field of Search ........................ 156/662; 252/79.3

[56] References Cited

U.S. PATENT DOCUMENTS

| | | | |
|---|---|---|---|
| 3,181,984 | 5/1965 | Tillis | 252/79.3 |
| 3,992,235 | 11/1976 | Garbarini | 252/79.3 |
| 4,517,106 | 5/1985 | Hopkins et al. | 252/79.4 |
| 4,582,624 | 4/1986 | Enjo et al. | 252/79.4 |
| 4,620,934 | 9/1986 | Hopkins et al. | 252/79.4 |

FOREIGN PATENT DOCUMENTS

| | | | |
|---|---|---|---|
| 0115583 | 8/1984 | European Pat. Off. | 252/79.3 |
| 2393840 | 9/1979 | France | 252/79.3 |
| 8353980 | 3/1983 | Japan . | |
| 0773063 | 10/1980 | U.S.S.R. | 252/79.3 |

OTHER PUBLICATIONS

*Fluorad, Fluorochemical Surfactants*, a Product Information Bulletin by 3M 1982.
Olin Chemical Specialties, Product Data Sheet, *Glycidol Surfactant 10G Specialty Nonionic Surfactant*, 1979.

Primary Examiner—Kenneth M. Schor
Assistant Examiner—Lori-Ann Cody
Attorney, Agent, or Firm—James B. Haglind

[57] ABSTRACT

Etching solutions used to etch, for example, silicon dioxide coated substrates in the manufacture of integrated circuits comprise an aqueous solution of ammonium fluoride and a wetting amount of a nonionic alkylphenol polyglycidol ether having the formula:

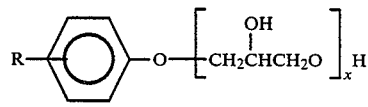

wherein R is an alkyl group having from about 4 to about 12 carbon atoms, and x is from about 3 to about 15. The etching solutions preferably contain hydrogen fluoride in a volume ratio of $NH_4F$ to HF of from about 3:1 to about 50:1. The novel etching solutions of the present invention have excellent wetting characteristics, will not incorporate metallic ions, and retain their wetting properties after extended periods of continuous filtration.

16 Claims, No Drawings

ETCHING SOLUTIONS CONTAINING AMMONIUM FLUORIDE AND AN ALKYLPHENOL POLYGLYCIDOL ETHER SURFACTANT

This invention relates to etching solutions used in the manufacture of integrated circuits. More particularly this invention relates to etching solutions containing wetting agents to properly wet substrates of components in the manufacture of integrated circuits.

As integrated circuit component dimensions become small, physical wetting by etchant solutions on substrate surfaces becomes more difficult. This is especially important for buffered oxide etchants i.e., ammonium fluoride/hydroflouric acid solutions used in silicon dioxide etching. These solutions exhibit extremely high surface tension values of 85 to 90 dynes/cm at typical etching temperatures. Because of the relatively low surface energies of the masking materials used and the photoresist topography, it is difficult to properly wet the substrate, which results in non-uniform etching and poor line reproduction.

While permanent ("predipping") of the component into a surfactant solution before placing the substrates in the etching solution is known, more satisfactory results are obtained by the addition of the wetting agent to the etching solution. However, most surfactants commonly used in the industry are insoluble in buffered oxide etchant solutions containing ammonium fluoride and hydrofluoric acid. Further, sufficient amounts of the wetting agent must remain in the etching solution after filtration through filters on the order of 0.2 microns to provide the desired wetting of the substrates during the etching process.

Wetting agents containing fluorochemical compounds have been employed as additives to $NH_4F/HF$ etching solutions to improve wetting properties. Examples of fluorochemical compounds include perfluorinated alkyl sulfonates described in U.S. Pat. No. 4,517,106, issued May 14, 1985, and fluorinated cycloalkane and cycloalkene sulfonates taught in U.S. Pat. No. 4,620,934, issued Nov. 4, 1986 to R. J. Hopkins et al; fluorine-containing carboxylic acids described in U.S. Pat. No. 4,582,624, issued Apr. 15, 1986 to N. Enjo et al; and fluorine-containing diamine compounds as described in Japanese Patent Kokai Publication No. 53,980/1983 published Mar. 30, 1983 by Daikin Kogyo KK. These surfactants may incorporate metallic ions with the etching solution and in addition are expensive.

There is a need for wetting agents which are readily soluble in buffered etching solutions containing ammonium fluoride, which will not incorporate metallic ions in their structure, and which provide excellent wetting properties at reduced costs.

It is an object of the present invention to provide etching solutions for use in integrated circuit manufacture having excellent wetting characteristics and which will not incorporate metallic ions.

Another object of the present invention is to provide buffered etching solutions containing ammonium fluoride and hydrogen fluoride having excellent wetting characteristics which are retained for extended periods of time.

A further object of the present invention is to provide a process for etching silicon dioxide substrates having desirable etching rates.

These and additional objects of the present invention are accomplished in an etching solution comprising an aqueous solution of ammonium fluoride and a wetting amount of a nonionic alkylphenol polyglycidol ether having the formula:

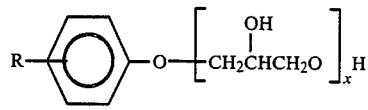

wherein R is an alkyl group having from about 4 to about 12 carbon atoms and x is from about 3 to about 15.

More in detail, the alkylphenol polyglycidol ethers which are useful as wetting agents in the etching solutions of this invention having the above formula include those in which the alkyl groups are, for example, butyl, hexyl, octyl, nonyl, and dodecyl. Preferred embodiments include those in which R has from about 8 to about 12 carbon atoms and includes octyl, nonyl, and dodecyl groups, and x is from about 6 to about 12. In a more preferred embodiment, R is primarily in the para position. It is noted that the x number represents an average number of glycidol units per alkylphenol unit. Surfactants of the above type (I) are commercially available and may be prepared by well-known methods as illustrated, for example, in U.S. Pat. Nos. 2,213,477 and 2,233,281.

These liquid nonionic wetting agents are employed in any suitable wetting amounts which, in the buffered oxide etching solutions, will enhance the wetting of the substrate to be etched. Suitable amounts include those in the range of from about 5 to about 50,000 parts per million by weight, preferably from about 25 to about 30,000, and more preferably from about 50 to about 5,000 parts per million.

The novel etching solutions of the present invention all retain their wetting properties after 0.2 micron filtration, even under continuous filtration conditions. Moreover, the etching solutions after filtering have the property of wetting substrates more ' effectively and yield more uniform results by etching small geometries (1 to 5 microns) and large geometries (>5 micron) of silicon dioxide in a patterned resist at the same rate without additional deleterious effects. Further, the nonionic wetting agents do not incorporate metallic ions in their structure.

The novel etching solutions of the present invention, as buffered oxide etchants, are aqueous solutions of ammonium fluoride having a concentration of between about 15 percent and about 40 percent by weight of $NH_4F$. Admixed with the ammonium fluoride is an aqueous solution of hydrogen fluoride in amounts which provide the buffered oxide etchant with at least about 3 parts by volume of $NH_4F$ to about 1 part by volume of HF and up to about 50 parts by volume of $NH_4F$ to about 1 part by volume of HF. In preparing the buffered oxide etching solutions of the present invention, commercially available concentrated aqueous solutions of $NH_4F$ (normally about 40 percent by weight) and HF (normally about 49 percent by weight) may be employed.

The novel etching solution of the present invention may be prepared in any suitable manner. For example, an aqueous solution of ammonium fluoride and the wetting agent may be prepared and the hydrogen fluoride then added; the aqueous solutions of ammonium fluoride and hydrogen fluoride and the liquid nonionic wetting agent may be simultaneously blended or the aqueous mixture of ammonium fluoride and hydrogen fluoride prepared and the liquid wetting agent then blended in.

Other additives normally used in buffered oxide etchant solutions may be included in the novel etching solutions of the present invention. For example, polar solvent diluents such as acetic acid, ethylene glycols, glycerol, and lower alkyl alcohols having from 1 to about 4 carbon atoms may be included.

The etching solutions are used to etch silicon dioxide coated substrates in the manufacture of integrated circuits employing methods and procedures known in the semiconductor industry.

The novel etching solutions of the present invention provide etchant solutions with reduced surface tensions after microfiltration which improves substrate wetting and yields superior etchant performance resulting in cleaner surfaces and greater uniformity of etched profiles without incorporating foreign metallic ions. The solutions are stable and have desirable shelf lives without phase separations of the wetting agent from the $NH_4F$ and HF components.

The following examples illustrate the present invention with no intention of being limited thereby.

EXAMPLE 1

A buffered oxide etching aqueous solution was prepared containing 7 parts by volume of ammonium fluoride and 1 part by volume of hydrogen fluoride. To 500 grams of the etchant solution was added 500 parts per million of a liquid nonionic nonylphenol polyglycidol ether containing about 10 glycidol units (Olin Glycidol Surfactant-10 G) as the wetting agent. The surface tension of the etching solution was measured with a Du Nouy Ring Tensiometer at 25° C. The solution was filtered through a 0.2 micron polytetrafluoroethylene filter (Millipore) and the surface tension measured again. The results are shown in TABLE I below.

COMPARATIVE EXAMPLES A, B and C

The procedure of EXAMPLE 1 was repeated exactly without the addition of a wetting agent and with the substitution of anionic wetting agents ammonium perfluoroalkyl sulfonate (Fluorad FC-93 3M Co.) ' and potassium perfluoroalkyl sulfonate (Fluorad FC-98 3M Co.) for the nonylphenol polyglycidol ether. The results are shown in TABLE I below.

TABLE I

| | | Surface Tension (dynes/cm) | |
|---|---|---|---|
| Example No. | Wetting Agent | Before Filtration | After Filtration |
| 1 | Surfactant 10 G | 30.8 | 32.3 |
| Comparative A | None | 82.3 | 82.3 |
| Comparative B | Fluorad FC-93 | 21.1 | 79.0 |
| Comparative C | Fluorad FC-98 | 21.2 | 43.2 |

TABLE I shows that the loss of wetting activity, as indicated by an increase in surface tension, is only slight after the filtration of the solution of EXAMPLE 1. For Comparative Examples B and C, however, after filtration there is a substantial increase in the surface tension indicating a significant loss of wetting activity.

EXAMPLE 2

A buffered etchant solution (800 mls) having an $NH_4F$:HF volume ratio of 7:1 and containing 200 parts per million of the wetting agent of EXAMPLE 1, was continuously passed through the 0.2 micron filter of EXAMPLE 1 at a rate of 800 mls per minute for a period of 6.5 hours. The surface tension of the solution was measured before filtering and after completion of the filtering period. The results are shown in TABLE II below:

TABLE II

| | | Surface Tension (dynes/cm) | |
|---|---|---|---|
| Example No. | Wetting Agent | Before Filtration | After Filtration |
| 2 | Surfactant 10 G | 31.2 | 39.5 |

This example shows that the loss of wetting activity after continuous filtration over an extended period of time is small.

EXAMPLE 3

Four inch silicon wafers were oxidized thermally to about 6000 A, (determined by ellipsometry) coated with positive photoresist to a thickness of about 1.2 microns, and patterned with masks having geometries of about 1.6 to about 2 microns. The etch time was then calculated. One wafer was immersed in the buffered oxide etching solution of EXAMPLE 2. The etching, at 25° C., was conducted until the 100 percent etch time, as calculated, was attained. The etched pattern was then rinsed in water. The wafer was then inspected with a light microscope with a magnification in the range of 400× to 1000×. The results are shown in TABLE III below.

COMPARATIVE EXAMPLES D, E and F

The procedure of EXAMPLE 2 was repeated exactly with three 4 inch silicon wafers. The patterned wafers were immersed in a buffered oxide etching solution (volume ratio 7:1 of $NH_4F$:HF) which contained no wetting agent for etch times of 100 percent, 105 percent, and 110 percent. The etched wafers were then rinsed in water and inspected using the procedure of EXAMPLE 2. The results are given in TABLE III below.

TABLE III

| | | Percent of Completely Etched Geometries | | |
|---|---|---|---|---|
| Example No. | % of Etch Time | 2 Micron | 1.8 Micron | 1.6 Micron |
| 2 | 100% | 100 | 100 | 100 |
| Comparative D | 100% | 63 | 51 | 42 |
| Comparative E | 105% | 98 | 95 | 89 |
| Comparative F | 110% | 100 | 100 | 98 |

EXAMPLE 3 illustrates that the etching solution of the present invention etches small geometries completely within the desired etch time without requiring overetching which results in the loss of pattern definition.

EXAMPLE 4

Solutions of buffered oxide etchant containing a volume ratio of $NH_4F$ to HF of 7:1 were prepared containing 5 parts per million and 100 parts per million of Surfactant 10 G. The surface tension of the solutions was measured using the method of EXAMPLE 1. The solutions were poured into a container which was sealed and stored at ambient temperatures for 6 months. Periodically the containers were opened and the surface tension of each solution measured. The final results are given in TABLE IV.

TABLE IV

| Surfactant | Concentration (ppm) | Surface Tension (dynes/cm) | |
|---|---|---|---|
| | | Initial | After 6 Months |
| Surfactant 10 G | 100 | 33.5 | 33.2 |
| Surfactant 10 G | 5 | 57.2 | 59.7 |

This example shows that the etching solution of the present invention is stable and retains its wetting properties over extended periods of time.

What is claimed is:

1. An etching solution comprising an aqueous solution of ammonium fluoride and a wetting amount of a nonionic alkylphenol polyglycidol ether having the formula:

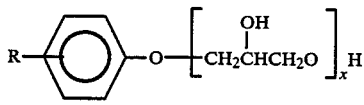

wherein R is an alkyl group having from about 4 to about 12 carbon atoms, and x is from about 3 to about 15.

2. The etching solution of claim 1 in which the ammonium fluoride is present in concentrations of from about 15 to about 40 percent by weight.

3. The etching solution of claim 1 in which hydrogen fluoride is present and the volume ratio of $NH_4F$ to HF is from about 3:1 to about 50:1.

4. The etching solution of claim 1 in which the wetting amount of nonionic alkylphenol polyglycidol ether is from about 5 to about 50,000 parts per million by weight.

5. The etching solution of claim 4 in which x is from about 6 to about 12.

6. The etching solution of claim 4 in which R is from about 8 to about 12 carbon atoms.

7. The etching solution of claim 6 in which the R is primarily in the para position.

8. The etching solution of claim 7 in which the wetting amount is from about 25 to about 30,000 parts per million by weight.

9. The etching solution of claim 8 in which the alkylphenol polyglycidol ether is a nonylphenol polyglycidol ether.

10. A process for etching a silicon dioxide coated substrate which comprises immersing the substrate in an aqueous etching solution comprised of ammonium fluoride and a wetting amount of a nonionic alkylphenol polyglycidol ether having the formula:

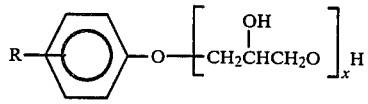

wherein R is an alkyl group having from about 4 to about 12 carbon atoms, and x is from about 3 to about 15.

11. The process of claim 10 in which the ammonium flouride is present in concentrations of from about 15 to about 40 percent by weight.

12. The process of claim 10 in which hydrogen fluoride is present and the volume ratio of $NH_4F$ to HF is from about 3:1 to about 50:1.

13. The process of claim 10 in which the wetting amount of nonionic alkylphenol polyglycidol ether is from about 5 to about 50,000 parts per million by weight.

14. The process of claim 12 in which x is from about 6 to about 12.

15. The process of claim 10 in which the R is from about 8 to about 12 carbon atoms.

16. The process of claim 15 in which the wetting a mount is from about 25 to about 30,000 parts per million by weight.

* * * * *